United States Patent [19]

Schoeppel

[11] Patent Number: 5,039,349
[45] Date of Patent: Aug. 13, 1991

[54] METHOD AND APPARATUS FOR CLEANING SURFACES TO ABSOLUTE OR NEAR-ABSOLUTE CLEANLINESS

[75] Inventor: John F. Schoeppel, San Rafael, Calif.
[73] Assignee: Veriflo Corporation, Richmond, Calif.
[21] Appl. No.: 524,985
[22] Filed: May 18, 1990
[51] Int. Cl.$^5$ .............................................. B08B 3/02
[52] U.S. Cl. ...................................... 134/26; 134/30; 134/95; 134/98; 134/108; 134/111
[58] Field of Search ....................... 134/10, 26, 30, 95, 134/98, 108, 111

[56] References Cited

U.S. PATENT DOCUMENTS

| | | |
|---|---|---|
| 4,129,457 | 12/1978 | Basi . |
| 4,325,746 | 4/1982 | Popplewell et al. ............... 134/26 |
| 4,409,999 | 10/1983 | Pedziwiatr ........................ 134/95 |
| 4,606,850 | 8/1986 | Malik . |
| 4,749,440 | 6/1988 | Blackwood et al. ............... 134/3 |

FOREIGN PATENT DOCUMENTS

| | | |
|---|---|---|
| 3610592 | 8/1987 | Fed. Rep. of Germany . |
| 50-147284 | 5/1974 | Japan . |
| 50-147287 | 5/1974 | Japan . |
| 60-21526 | 2/1985 | Japan . |
| 60-106896 | 6/1985 | Japan . |
| 61-160932 | 7/1986 | Japan . |
| 61-224424 | 10/1986 | Japan . |
| 63-114128 | 5/1988 | Japan . |
| 63-274149 | 11/1988 | Japan . |
| 1573206 | 8/1976 | United Kingdom . |
| 1573208 | 8/1976 | United Kingdom . |

Primary Examiner—Theodore Morris
Assistant Examiner—Saeed Chaudhry
Attorney, Agent, or Firm—Antonelli, Terry, Stout & Kraus

[57] ABSTRACT

A method and apparatus for cleaning surfaces to absolute or near-absolute cleanliness involves spraying jets of heated cleaning solution so that it flows over and scrubs the surfaces to be cleaned. The cleaning solution is continuously recirculated and filtered during cleaning to remove over 99% of all particles having a diameter equal to or greater than $0.02\mu$. The cleaned surface is rinsed with heated, filtered deionized water and dried to provide a surface having absolute or nearly-absolute cleanliness to the limit of the best commercial instrumentation, e.g., $\leq$ five particles with a diameter of $\geq 0.02\mu$ per cubic foot of gas flowed over a cleaned surface as detected by a laser particle counter. The method is useful for cleaning gas valves and regulators and components thereof as well as existing gas flow equipment, for example, for use in semiconductor processing equipment. The cleaned surfaces are sterile and therefore also useful in the health and pharmaceutical industries.

38 Claims, 2 Drawing Sheets

1

METHOD AND APPARATUS FOR CLEANING SURFACES TO ABSOLUTE OR NEAR-ABSOLUTE CLEANLINESS

TECHNICAL FIELD

The present invention relates to a method and apparatus for cleaning a surface to absolute or near-absolute cleanliness. The method and apparatus are particularly useful for cleaning stainless materials of gas flow equipment including valves and regulators, for use in semiconductor processing and in the health and pharmaceutical industries.

BACKGROUND ART

During the past ten years the requirements for cleanliness in semiconductor processing equipment have increased at least a hundred times. In the past three years alone requirements have increased ten fold. There is little doubt that the industry will need "absolute" cleanliness, that is to the limit of current measurement, in the next several years.

Semiconductor feature sizes have been cut in half in the past few years and packing densities have doubled or tripled in the same time period. It also appears that the rate of change is accelerating rather than holding at past rates. With these changes, the problems caused by contamination in semiconductor processing become even more serious.

Cleanliness is also important in the health and pharmaceutical industries, driven by the need to reduce the contamination of treatment processes. In view of these requirements, there is a need for gas flow equipment such as valves and regulators, for use in semiconductor processing and in the health and pharmaceutical industries, which is cleaned to previously unheard of levels.

In the past, such components have been cleaned almost universally by use of solvents. In addition to the problems of atmospheric pollution and operator health hazards, solvents do not clean absolutely. They leave films and particle residuals. Ultrasonic cleaning may also drive particles into crevices in instrument parts, for a later release. Chlorofluorocarbon cleaning solvents sold under the trademark Freon are examples of known cleaning solvents as well as 1,1,1-trichloroethane and methylene chloride.

Currently available, specialty-cleaned, double-bagged regulators and valves (off-the-shelf) cleaned with conventional solvents and methods have been tested for cleanliness by passing dry nitrogen gas, filtered through a 0.01 $\mu$ filter, through the components and then through a laser particle counter for detecting particles. The results showed particle counts of 100 to 1,000 or more particles of 0.1 $\mu$ diameter or larger per cubic foot of gas flow. These dirty or contaminated components will not clean up once installed in a gas flow system even though large amounts of dry nitrogen or argon gas are passed through the system. Thus, the components become sources of contamination during semiconductor wafer manufacture or other associated process.

The lack of cleanliness of the components cleaned by conventional solvents, methods and apparatus is also problematical where active ions and organic contamination such as organic films remain on the components. Active ions, e.g. metallic ions, can adversely affect the process in which the equipment is to be used. Organic contamination will not show up in the aforementioned particle count with a laser particle counter but can react in a treatment process to produce harmful effects.

In the past it has been postulated that such residual contamination was due to "shedding" of particles from a soft seat. Applicant's research in connection with the present invention has shown this not to be true and that an absolute level of cleanliness can be achieved by means of the present invention.

It is well known to use of choline (trimethylhydroxyethylammonium hydroxide) and hydrogen peroxide in a de-ionized water solution for cleaning silicon wafers in semiconductor production. One early formulation was known as the "RCA" cleaning method because of its discovery at RCA many years ago. Japanese Patents 63-114,128 and 63-272,149 involve similar solutions, in some cases with the addition of a surfactant.

Choline based cleaning is excellent for silicon wafers. However, the results of research by applicant in connection with the present invention indicate that choline gives poor results when cleaning stainless steel and plastic. Choline is unstable at the high processing temperatures required for stainless steel cleaning with the method of the present invention as discussed below. Also, hydrogen peroxide cannot be safely heated to near boiling temperatures in a mixture with an organic solute. An "RCA" type bath must necessarily be used at bath temperatures under 50° C.

German Patent DE 3,610,592 discloses a sprayable oven and grill cleaner for removing baked on food residues wherein tetraalkyl ammonium hydroxide is substituted for the usual sodium hydroxide with the solvent of plain water, not de-ionized water. This strong, but crude cleaner is not applicable to instrument products for obtaining absolute or near-absolute cleanliness.

DISCLOSURE OF INVENTION

Thus, an object of the present invention is to provide an improved method and apparatus for cleaning surfaces of materials, particularly stainless materials such as stainless steel and other stainless metals, especially where the members being cleaned are to be used in applications which require a high degree of cleanliness of the finished surfaces. The method and apparatus are also applicable to other "stainless" materials including resistant plastics and non-stainless materials.

A further object of the invention is to provide a method and apparatus for cleaning materials such as stainless steel which can be used to attain absolute cleanliness for meeting current and future industry requirements, absolute cleanliness meaning near-zero contamination of any kind on wetted surfaces, when measured by current state-of-the-art analytical equipment.

An additional object of the invention is to provide a method and apparatus for cleaning materials which result in a level of cleanliness of the cleaned surface which is at least one order of magnitude better than that attained in a production setting on like surfaces by conventional methods and apparatus.

Another object of the invention is to provide a method and apparatus for cleaning materials such as stainless steel which are environmentally sound as well as safe to the operator. A still further object of the invention is to produce members, e.g. gas flow equipment, cleaned with the method and apparatus of the invention, which members have a higher level of cleanliness than similar members of the prior art in production settings.

These and other objects of the invention are attained by the use of the method of the invention for cleaning a surface to absolute or near-absolute cleanliness, the method comprising contacting a surface of a member to be cleaned with a cleaning solution to clean the surface and flowing a rinse liquid in contact with the cleaned surface to rinse the cleaned surface, wherein the rinse liquid is recirculated during the rinsing, the recirculated liquid being filtered in one pass to remove all particles having a diameter $\geq 0.2\ \mu$. According to the preferred embodiment of the invention, the rinse liquid is recirculated multiple times during rinsing and is filtered each time it is recirculated so as to remove over 99% of particles having a diameter $\geq 0.02\ \mu$ from the rinse liquid. The rinse liquid is preferably de-ionized water which has a resistance between 17 and 18.4 megohm-cm. The rinse liquid is also preferably heated to a temperature of at least 60° C. before flowing it into contact with the clean surface. Preferably, the final rinse is heated to a temperature of at least about 85° C.

The rinse liquid is flowed at high speed, 60 mph, into contact with the cleaned surface. A spray head is employed which emits a large number of small jets of the rinse liquid at the high speed for rinsing the cleaned surface. Large volumes of the rinse liquid, e.g. 40 gpm, are flowed over the cleaned surface during the rinsing. Following rinsing, the cleaned and rinsed surface is dried by blowing the surface free of surface water with dry, filtered nitrogen gas. The cleaned and dry member can then be further dried in an oven to reduce adsorbed moisture. The member being cleaned in the disclosed embodiment is a gas flow regulator device or a component thereof formed of stainless steel.

Prior to the cleaning according to the method of the invention, the surface of the member is subjected to a preliminary solvent cleaning as in a conventional solvent bath, and is then electroplated and passivated. The member is then cleaned by flowing the cleaning solution in contact with the surface to be cleaned. The cleaning solution is recirculated during the cleaning with the recirculated cleaning solution being filtered to remove all particles having a diameter $\geq 0.2\ \mu$. Preferably, the cleaning solution is recirculated multiple times during the cleaning and is filtered each time it is recirculated in order to remove over 99% of particles having a diameter $\geq 0.02\ \mu$.

The method also includes the step of heating the cleaning solution before contacting the surface to be cleaned with the cleaning solution. The cleaning solution is likewise flowed into contact with the surface to be cleaned at high speed, $\geq 60$ mph. Jets of the cleaning solution are impinged on the surface to create a scrubbing action through the use of a spray head of the apparatus of the invention. Surfaces cleaned according to the method of the invention utilizing a composition of the invention as discussed hereinafter, have a surface which is at least nearly absolutely clean such that when dry nitrogen is filtered through a 0.01 $\mu$ filter, passed over the cleaned, dried surface and through a laser particle counter, the laser particle counter will detect less than five particles having a diameter $\geq 0.1\ \mu$ per cubic foot of gas flow, a condensation nucleating counter (CNC) will detect no more than five particles having a diameter of 0.02 $\mu$ or larger and residual surface ions and residual surface organics, if any, are present in a concentration of less than one part per million.

Further, according to the method of the invention, the member with the at least nearly absolutely clean surface is assembled into a gas flow equipment whereby the surface may become contaminated such that it is no longer absolutely clean, and thereafter the surface is recleaned to a condition of at least nearly absolute cleanliness by flowing gas over the surface in the gas flow equipment to sweep the new contamination from the surface. As a possible explanation, the mechanism for bonding particles of contaminant to the surface is apparently broken down during the absolute cleaning according to the invention so that the particles deposited during subsequent contamination can be broken out or swept away merely with the passage of gas over the surface. In effect, the absolute cleaning method provides a "nonstick" surface on the cleaned member.

The apparatus of the invention for cleaning a surface to absolute or near-absolute cleanliness comprises means for contacting a surface of a member to be cleaned with a cleaning solution to clean the surface, and means for flowing a rinse liquid in contact with the cleaned surface to rinse the cleaned surface. The means for flowing a rinse liquid includes means for recirculating the rinse liquid and means for filtering the recirculated liquid to remove all particles having a diameter $\geq 0.2\ \mu$ in one pass through the filter, and with multiple passes, e.g. ten or more, to remove over 99% of all particles having a demeter of 0.02 $\mu$ or larger. The apparatus further comprises means for heating the rinse liquid before it flowed in contact with the cleaned surface. The means for flowing the rinse liquid in contact with the cleaned surface includes a least one spray head having apertures therein for forming jets of rinse liquid for impinging upon the cleaned surface.

The means for flowing a rinse liquid comprises a container holding a supply of the rinse liquid, a pump for pumping rinse liquid from the container to and through means for filtering and to the surface for rinsing the surface. The pump is a diaphragm pump in the disclosed, preferred embodiment. Drain means are located adjacent the surface being rinsed for returning the used rinse liquid to the container for recirculation. Means are also provided for drying the rinsed surface. This means for drying includes means for blowing the surface with dry, filtered nitrogen gas.

The means for contacting the surface with a cleaning solution includes a container holding a supply of the cleaning solution and a pump for pumping cleaning solution from the container to and through the means for filtering the rinse liquid for filtering the cleaning solution to remove all particles having a diameter $\geq 0.2\ \mu$ with one pass through the filter. While preferably the same filter is used to successively filter both the cleaning solution and rinse liquid, separate filters could be employed for each liquid. The apparatus also includes means for recirculating the used cleaning solution back into contact with the surface by way of the means for filtering. In this way it is possible to filter the cleaning solution multiple times, e.g. forty times, during cleaning for removing over 99% of the particles therein having a diameter 0.02 $\mu$. Means are also provided in the apparatus for rinsing the cleaned surface with a rinse liquid which is not recirculated. This provides a preliminary rinse before the final, recirculated rinse of the cleaned surface. Means for heating the cleaning solution are located within the container for the cleaning solution.

The apparatus is preferably microprocessor controlled for implementing washing and rinsing cycles by way of pneumatic valves in fluid supply and fluid return lines of the apparatus and an air line to the pneumatic diaphragm pump. Alternatively, manual operation could be employed.

A preferred composition for use with the apparatus comprises a caustic cleaning solution containing an organic base with no metallic ions in an aqueous solution of de-ionized water. The organic base is preferably a quaternary ammonium hydroxide, particularly a quaternary ammonium hydroxide having unsubstituted alkyl groups. The quaternary ammonium hydroxide of the disclosed, preferred embodiment is tetramethyl ammonium hydroxide.

The de-ionized water solvent of the solution has a resistance which is equal to or greater than 17 megohm-cm at 25° C, and preferably between 17 and 18.4 megohm-cm. The composition of the preferred embodiment further comprises an optional non-ionic surfactant which is present in the solution in an amount equal to or less than 0.1% by volume. The concentration of the tetramethyl ammonium hydroxide is preferably 1% to 10% by volume. The pH of the solution is equal to or greater than about 11, especially within the range of 11 to 13 plus.

Another feature of the composition of the invention is that as the result of filtration, the solution contains no particles having a diameter larger than 0.2 $\mu$ and after repeated filtering over 99% of all particles having a diameter of 0.02 $\mu$ or larger are removed. The solution is also characterized by being heated to a temperature between 60° and 100° C., and preferably at least about 85° C. for cleaning stainless steel.

The high velocity impingement or scrubbing of the cleaning solution on the surface to be cleaned, together with a relatively high volume of flow of the powerful cleaner at elevated temperatures, progressively removes any organic films or particles on the stainless surface. Typically, all organic surface films are freed during the cleaning, with the resulting effluent being capable of being rinsed away. Any physical or physical-chemical bond with the stainless surface is broken and the surface rendered clean.

As noted above, the method is useful for cleaning stainless steel gas flow equipment, e.g. valves and regulators for use in semiconductor processing equipment but other metals, for example high nickel alloys and non-metals, and other types of components can be advantageously cleaned with the cleaning composition, method and apparatus of the invention. The high temperature cleaning solution kills bacteria and removes them to sterilize the cleaned surface which is especially useful in cleaning equipment for use in the health and pharmaceutical industries.

A member cleaned according to the invention has a surface formed of a stainless material which is absolutely or nearly absolutely clean in that when dry nitrogen, filtered through a 0.01 $\mu$ filter, is passed over the clean surface and through a laser particle counter, the laser particle counter detects less than five particles having a diameter equal to or greater than 0.1 $\mu$ per cubic foot of gas flow, and a CNC counter shows no more than five particles of 0.02 $\mu$ or larger per cubic foot of gas flow and wherein any residual ions and surface organics are present in a concentration of less than one part per million. The members cleaned in the disclosed embodiment are gas flow equipment, namely regulators and valves of stainless steel as noted above.

These and other objects, features and advantages of the present invention will become more apparent from the following description when taken in connection with the accompanying drawings, which show, for the purpose of illustration only, several embodiments in accordance the present invention.

BEST MODE FOR CARRYING OUT THE INVENTION

Figure 1:
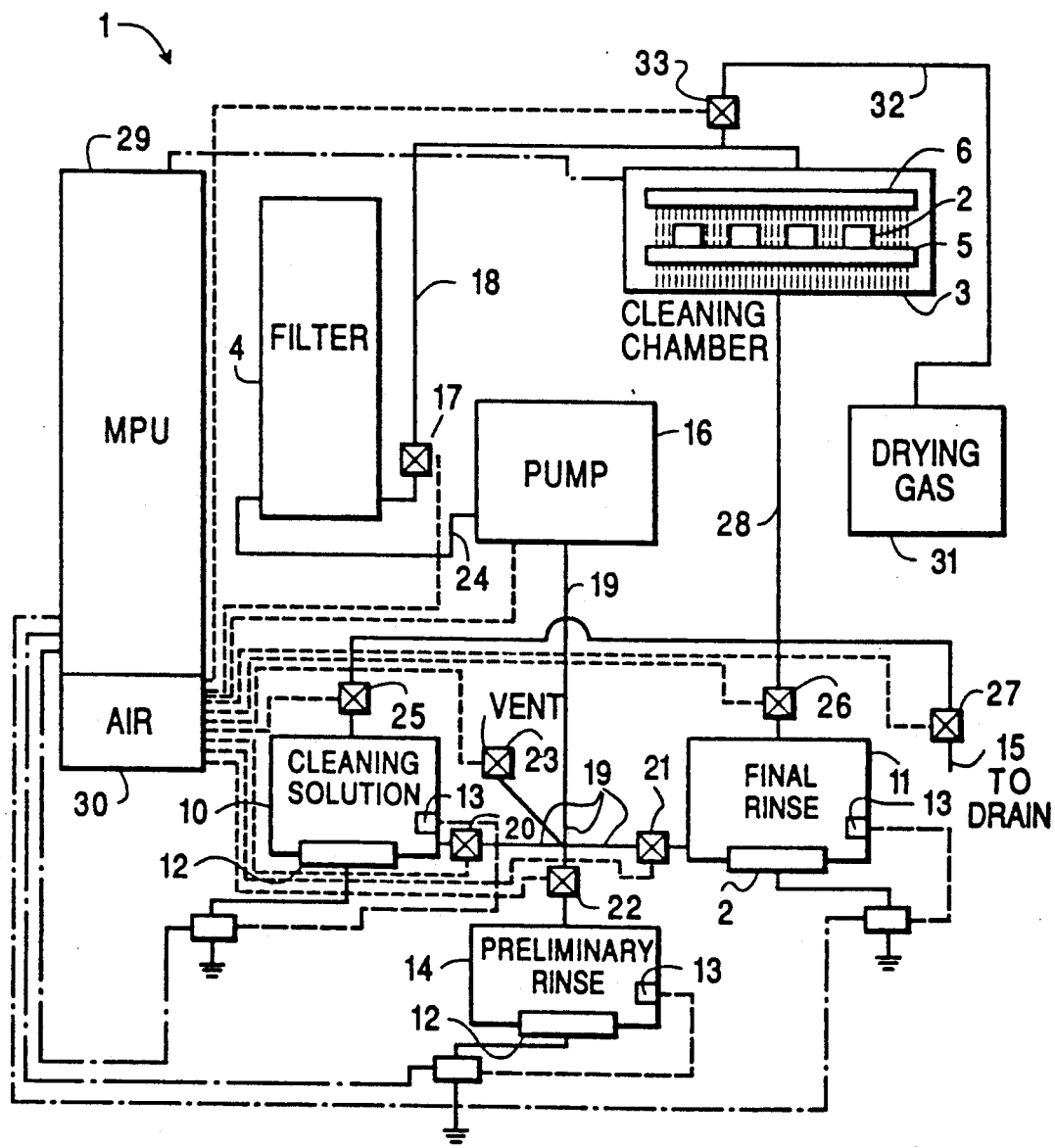
FIG. 1 is a schematic illustration of a cleaning apparatus according to the invention for performing the method of cleaning a stainless surface using the composition of the invention.

A composition of the invention for cleaning materials, particularly stainless materials, such as stainless steel and other stain resistant metals and non-metals, comprises an organic base with no metallic ions in an aqueous solution of de-ionized water. By not introducing metallic ions to the surface being cleaned, the subsequent rinse of the cleaned surface need only capture residual ions from other sources on the surface since none are added by the cleaning process itself. Semiconductor processing equipment including gas valves, regulators, tubing, etc. are preferably free of active ions including metallic ions as they can adversely affect the semiconductor manufacturing process.

An important characteristic of the organic base of the composition is that it not decompose at temperatures approaching the boiling point of the aqueous solvent, at temperatures of 85°-90° C., for example. The preferred organic base of the composition is an organic ammonium hydroxide in which the ammonium organic substituents are hydrocarbons. Preferably, where the organic ammonium hydroxide is $[NR_1R_2R_3R_4]^+OH^-$, $R_1$ to $R_4$ are selected from the alkyl groups methyl, ethyl, propyl and butyl, or phenyl. In the disclosed, preferred embodiment the organic ammonium hydroxide is a quaternary ammonium hydroxide, and especially a quaternary ammonium hydroxide which has an unsubstituted alkyl group, namely tetramethyl ammonium hydroxide (TMAH), but other quaternary ammonium hydroxides such as tetraethyl-, tetrapropyl-, or tetrabutyl-ammonium hydroxide could be used. More generally, the four groups on the nitrogen of the quaternary ammonium hydroxide may be aliphatic or aromatic, illustratively phenyl could be used as one of the groups, e.g. trimethylphenyl.

The concentration of the organic base with no metallic ions in the aqueous solution of de-ionized water can range from 1% to 25% or higher, by volume. The organic base solute must be concentrated enough to destroy organic films and particles and break organic bonds to the surface being cleaned at the elevated temperature of the solution which contacts the surface to be cleaned. In the preferred embodiment, the concentration of TMAH is within the range of 1% to 10% by volume. The de-ionized water solvent has a resistance which is greater than or equal to 17 megohm-cm at 25° C. preferably between 17 and 18.4 megohm-cm. The aqueous solvent of the composition is preferably de-ionized water because at the elevated temperatures, 85°-95° C., the de-ionized water itself is a very aggressive cleaner. An aqueous solvent is also preferred due to environmental considerations. The solution exhibits a typical pH of between 11 and 13 plus. The solution can be used for many cleaning cycles as discussed below, and when the pH of the solution has dipped below approximately 11, the organic base is replenished or replaced with a new solution. The de-ionized water used to make the solution is filtered to remove all particles having a diameter $0.2 \mu$ or larger. The TMAH used is electronic grade TMAH which is also filtered to the same level.

Optionally, a non-ionic surfactant is present in the composition of the invention for lowering the liquid surface tension thereby making it easier for the organic base in the solution to attack any organic films or particles on the stainless surface. Any physical or physical-chemical bond of these contaminants with the stainless surface is broken during cleaning and the surface rendered clean. A non-foaming type of non-ionic surfactant is preferred. As an example, a block polymer non-ionic surfactant, such as that sold under the trademark Pluronic by BASF Wyandotte, can be used. The non-ionic surfactant is present in very small quantities, preferably less than 0.1% by volume and 0.01% to 0.1% by volume in the preferred embodiment. Other non-ionic surfactants could be employed.

Other characteristics of the composition for cleaning stainless materials of the invention are that the composition preferably be heated to temperature which is equal to or greater than 60° C. In the disclosed example of the method of the invention, the cleaning solution is heated to 85° C. before and during the cleaning. An aggressive cleaning occurs at the high temperature. Each reduction of 10° C. in the cleaning temperature can reduce the cleaning activity as much as fifty percent.

In order to obtain absolute or near-absolute cleanliness of the stainless surface being cleaned, another characteristic of the composition of the invention is that it contain no particles $0.2 \mu$ in diameter or larger with one pass through the filter as discussed in more detail below. The cleaning solution which contacts the surface to be cleaned preferably is flowed over the surface. Jets of the cleaning solution impinge upon the component being cleaned so that the cleaning solution flows over the surface to be cleaned whereby a scrubbing action on the surface is obtained. The flowing cleaning solution is continuously recirculated at high flow rates with the liquid solution being repeatedly filtered in the closed, recirculation loop of the apparatus of the invention. By continuous recirculation of the liquid cleaning solution through the filter multiple times during cleaning, over 99% of the particles having a diameter $0.02 \mu$ or larger are removed from the solution as discussed below in connection with FIG. 4.

An apparatus of the invention for cleaning stainless material according to the method of the invention with a composition of the invention is schematically shown in FIG. 1. The apparatus is capable of heating and pumping the caustic cleaning solution of the invention through a spray head at a velocity in excess of 60 mph and at flow rates of 30 to 60 gallons per minute for cleaning the surfaces of components 2 in a closed cleaning chamber 3 of the apparatus. The apparatus also heats and pumps rinse liquid through the apparatus for rinsing the components after they are cleaned. The cleaning liquid and at least the final rinse liquid are both recirculated in a closed loop fashion through the apparatus multiple times during cleaning and rinsing, respectfully. A filter 4 is located in the closed loop flow path for filtering the circulating liquids to remove particles therefrom.

Figure 2:
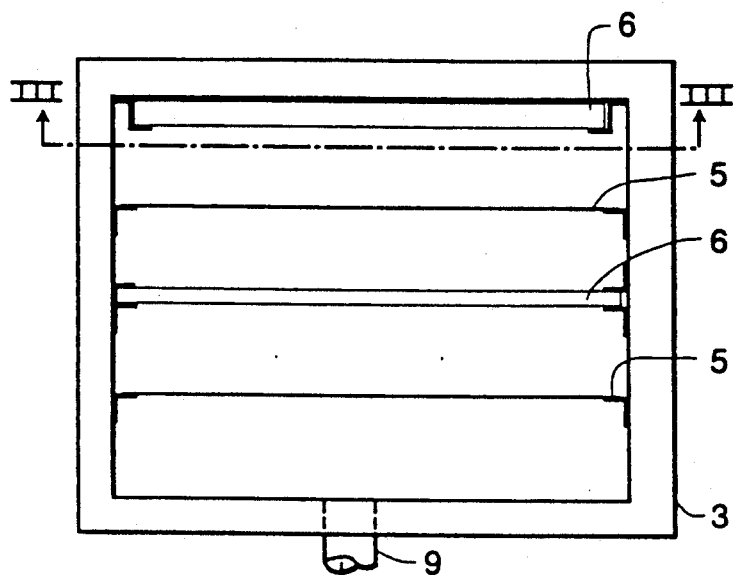
FIG. 2 is an enlarged, schematic view of the cleaning chamber of the apparatus of FIG. 1 wherein upper and lower spray heads and opposing shelves are located.
Figure 3:
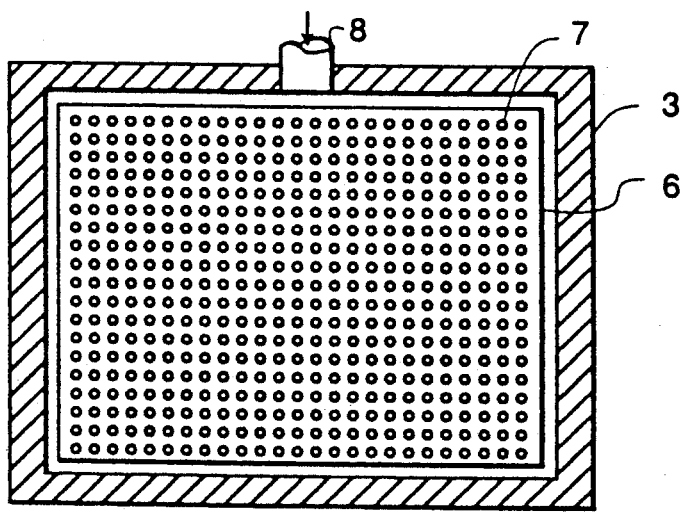
FIG. 3 is a cross-sectional view through the cleaning chamber of FIG. 2 taken along the line III—III and illustrating the lower surface of the upper spray head.

The cleaning chamber 3 depicted in FIGS. 1 through 3 is a stainless steel chamber which is capable of being sealed to the outside. Access to the chamber for loading and unloading components 2 is by way of a door, not shown, preferably having a heavy tempered glass plate to enable the operator to see the cleaning action directly. The components 2 within the cleaning chamber 3 are located on perforated shelves 5. While only a single shelf 5 is shown in the schematic drawing of FIG. 1, in the more detailed view of the cleaning chamber shown in FIG. 2, it is seen that upper and lower shelves 5 are provided inside the chamber 3. The chamber is approximately $18 \times 24$ inches inside in the disclosed embodiment but the size could be varied depending upon the application.

Mounted in the chamber are two spray heads 6, rectangular in shape, each approximately $16 \times 22 \times \frac{3}{4}$ inches. As shown in FIG. 3, the surface of each spray head is perforated with approximately seventeen hundred holes 7, each with a diameter of 0.012 to 0.024 inch, depending upon the inlet pressure and the pump capacity. The cleaning solution is supplied to each of the spray heads 6 under pressure so that downwardly directed jets of cleaning solution are launched from the small holes 7 of the spray heads 6 at a velocity in excess 60 mph. The spray heads 6 are mounted approximately 4 inches from the components 2 to be cleaned. The cleaning solution from the jets impinges with force against the surface of the components 2 and flows over the component surfaces whereby a scrubbing action is obtained. Flow rates in the chamber are 30 to 60 gallons per minute, providing copious streams which carry away dislodged particles or saponified organic matter to the filter 4. The flow of cleaning solution to the spray heads 6 is by way respective inlet fittings 8 (FIG. 3) which extend through the wall of the cleaning chamber 3. The cleaning liquid, after flowing over the surfaces of the components 2, drains by gravity from the chamber through outlet fitting 9 in the bottom of the chamber as shown in FIG. 2.

A large, skid mounted stainless steel complex of tanks, pump, filter and pneumatic valves provides the pumping capacity of the apparatus 1 for the cleaning chamber 3. Two twenty gallon stainless steel tanks 10 and 11 contain the coating solution and the final rinse, respectively. Each tank has large electric heaters 12 submerged in the lower portion thereof and a thermostat 13 for holding preset temperatures in the liquids in tanks 10 and 11. In addition, a tank 14, also provided with an electric heater 12 and a thermostat 13, contains at least forty gallons of a preliminary rinse liquid which is pumped through the filter 4 and spray heads 6 in cleaning chamber 3, to drain 15 without recirculation.

A pump 16 of the apparatus is a large pneumatic diaphragm pump made of 316 stainless steel with a Teflon diaphragm and valve seats. The pump 16 has sufficient capacity to circulate all fluids at high pressures, typically in the range of 30 to 100 or more psi, depending upon the design of the spray heads 6. The pump 16 is capable of pumping nearly 100% of each fluid back into its own chamber by pumping air through the filter 4 and pneumatic valves 17 in the fluid lines 18 from the filter 4 to the respective spray heads 6, only one of the two fluid lines 18 and with pneumatic valve 17 to a spray head 6 is shown in FIG. 1. The pump 16 also sucks all fluid out of the inlet line 19 between pneumatic inlet valves 20, 21 and 22 and the pump, by means of a pneumatically controlled vent valve 23.

Figure 4:
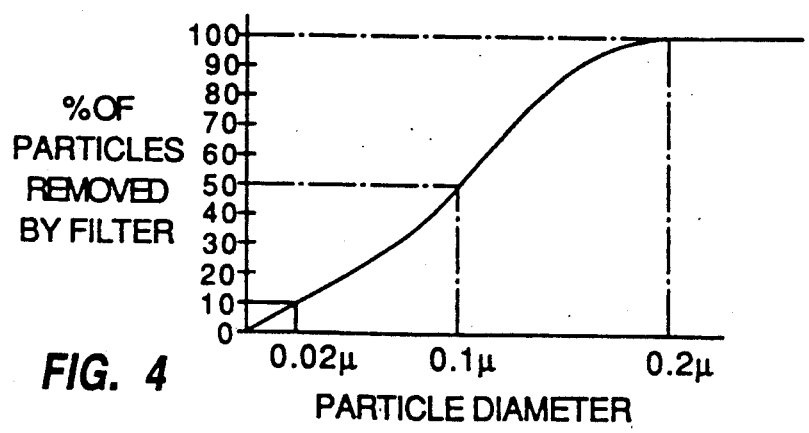
FIG. 4 is a graph of a performance characteristic of the filter of the apparatus of FIG. 1 depicting the percent of particles removed by the filter as a function of particle diameter for a single pass of the cleaning solution through the filter.

Fluid line 24 communicates the output of the pump 16 to the inlet of the filter 4. The filter 4 is a large cylinder which contains three, thirty-inch filter elements arranged in parallel within the cylinder of the filter. The outlet of the filter is communicated with the inlet fittings 8 of the spray heads 6 and the chamber 3 through fluid lines 18 in the form of flexible hoses. Pneumatic valves 17 are located in the fluid lines 18 as noted above. The filter 4 according to the preferred embodiment is a polysulfone filter by Filterite. The filter is alkali resistant and has an absolute filtration rating of 0.2 micron for liquid circulated through the filter. That is, as shown in FIG. 4, the filter 4 will remove 100% of particles having a diameter of 0.2 micron or larger with one pass of the liquid through the filter. Lower percentages of smaller particles are also removed, e.g., approximately 50% of particles having a particle diameter of 0.1 micron are removed and about 10% of particles having a diameter of 0.02 micron are removed with one pass of liquid through the filter. The invention takes advantage of this characteristic by circulating the cleaning solution as well as the final rinse liquid in a closed system of the apparatus 1 multiple times, 40 to 60 passes through the filter, so that over 99% of all particles having a diameter 0.02 micron or greater are removed by the filter. This is possible by circulating the cleaning solution and also the final rinse liquid at high flow rates, typically 40 to 60 gallons per minute through the filter and cleaning chamber in the closed loop of the apparatus for a period of time of 10 minutes or more, for example. All of the fluid lines in the apparatus 1, except the flexible holes of fluid lines 18, are welded 316 stainless steel tubing and all valves are of similar material with Teflon seats. The system is impervious to outside contamination.

Pneumatic outlet valves 25, 26 and 27 in drain line 28 control the outlet flow to return it to a selected one of the cleaning solution tank 10, the final rinse tank or to drain 15, respectively, depending upon which valve is opened. The microprocessor 29 is suitably programmed for opening and closing the pneumatic valves of the apparatus by way of a source of air pressure 30 upon initiation of a cleaning method with the apparatus 1 of the invention for implementing the washing and rinsing cycles. The microprocessor also operates switches to supply electric current to the heaters 12 of the tanks for maintaining the cleaning and rinse liquids at the predetermined elevated temperatures.

The pump 16 and fluid tubing are so configured that the system can be pumped dry, in order that fluids not be mingled as the apparatus switches from one fluid to another. The filter 4 has a constant air bleed that enables the filter to be pumped dry, then restarted without delay. Temperatures of fluids can be reset remotely from a main computer control of the microprocessor 29 and recorded, if necessary. The flat spray heads 6 are made of sheet stainless steel, reinforced to take force in excess of 43,000 pounds, yet are only ¾ inch thick. Jet forming holes produce maximum velocity for the pressures used. An interlock is provided for the door of the cleaning chamber 3, in order that the unit cannot be operated with the door open.

An example of the method of the invention using a cleaning composition and the apparatus of the invention is for cleaning 316 stainless steel components for valves and regulators for use in controlling the flow of gas in semiconductor manufacturing processes and equipment. Surfaces of the components 2 to be cleaned were subjected to solvent cleaning in a conventional solvent cleaning bath and then electropolished and passivated in a conventional manner. From this base line of cleanliness, the components were subjected to cleaning according to the invention to achieve absolute or near-absolute cleanliness as discussed below.

The components 2 which had been subjected to the aforementioned preliminary cleaning were located in the cleaning chamber 3 on the shelves 5 beneath the spray heads 6. A cleaning solution of tetramethyl ammonium hydroxide in a concentration of 1 to 10% by volume, together with a non-ionic surfactant in a concentration of less than 0.1% by volume, in a solvent of de-ionized water with a resistance in the range of 17 to 18.4 megohm-cm, was used for washing the components. The pH of the solution was 11 to 13.5. Twenty gallons of the solution was provided in the tank 10 and maintained at a temperature 85° C. by means of the electric heaters 12 in the tank. Pneumatic inlet valve 21 from the tank 10 and pneumatic valves 17 in the fluid lines 18 were opened and the pump 16 operated for pumping the hot cleaning solution from the tank 10 through the filter 4 and spray heads 6. From the cleaning chamber, the cleaning solution was drained and returned to the cleaning tank 10 by way of open pneumatic outlet valve 25. The liquid circulated in this closed loop by the pump 16 at a flow rate between 40 and 60 gallons per minute. Cleaning was performed continuously for a period of 20 minutes so that the complete volume of 20 gallons of cleaning solution from tank 10 was circulated at least 40 times through the filter 4 whereby over 99% of the particles having a diameter within the range of 0.02–0.1 micron were removed by the filter 4. The cleaning solution applied to the components 2 in the cleaning chamber 3 contained no particles having a diameter 0.2 micron or larger.

Following the 20 minute cleaning, 40 gallons of de-ionized rinse water heated to 60° C. and having a resistance of 17 to 18.4 megohm-cm was pumped from the tank 14 by opening valves 21 and 17 in the fluid lines to the filter and cleaning chamber and the valve 27 to drain. The initial rinse was not recirculated. As a final rinse, 20 gallons of 85° C., 18 megohms-cm, de-ionized water from the tank was continuously circulated through the cleaning chamber by way of the spray heads 6 to effectively de-ionize the parts being cleaned. The rinsed components 2 were then blown free of surface water with 0.01 micron filtered dry nitrogen gas from a source 31 by way of fluid line 32 and pneumatic valve 33. The components 2 were then transferred to an oven and dried at 125° C. in dry nitrogen to get rid of adsorbed moisture. A vacuum dry for an extended period is an option. The components 2 were loaded in and unloaded from the cleaning chamber 3 and drying oven under Class 10 conditions. The cleaned, dry components were bagged before delivery to an assembly clean room where they were assembled to form the gas flow control components, namely flow regulators, valves, etc.

Tests were conducted to determine the cleanliness of the components 2 cleaned according to the method of the invention. These involved passing dry nitrogen or argon gas, filtered through a 0.01 micron filter, over the cleaned surfaces and through a laser particle counter. The laser particle counter detected less than five particles having a diameter of 0.1 micron or larger per cubic foot of gas flow, with either no residual surface ions and residual surface organics or less than one part per million thereof remaining on the cleaned surfaces. The cleaned, wetted surfaces were protected with a chrome oxide layer in the case of the 316 stainless steel components with the adsorbed moisture reduced to a limit consistent with the materials of construction. Thus, the near absolute cleanliness obtained with the method of the invention provides levels of cleanliness several orders of magnitude better than that available for competitive, specialty-cleaned, double-bagged regulators and valves, off-the-shelf, which comparative tests showed to be contaminated such that particle counts of 100–1000 or more particles of 0.1 micron diameter or larger per cubic foot of gas flow, were obtained. After cleaning according to the method of the invention and based upon the cleanliness tests results, no so-called seat shedding was found. The tests on the components cleaned according to invention also showed no particles of 0.2 micron or larger and counts of no more than five particles per cubic foot of gas at 0.02 micron diameter or larger.

It is well known that de-ionized water can develop bacteria colonies when small amounts of it are allowed to lay stagnant. In the event that such pools develop in the apparatus 1 of the invention, the exposure of those bacteria to the strong organic base, for example TMAH, during the next cleaning cycle at temperature will kill the bacteria and the filters will filter out the dead bacteria so that the cleaned parts are sterile. The de-ionized water rinse is sterilized by the high heat and passage through the bacteria-proof filter.

While the methods and apparatus are shown particularly for cleaning components 2 placed within the cleaning chamber 3 of the apparatus, the method and apparatus can also be used to circulate cleaning and rinse liquids in closed loop fashion through existing gas flow equipment such as gas "jungles" used in semiconductor production. These are typically welded systems of stainless steel tubing, valves and regulators which must cleaned as an assembly. Since such a device can be several feet long, it is cleaned by attaching the pressure outlet of the filter to the inlet(s) of the welded system and the outlet of the device to the pipeline of the apparatus 1 downstream of the chamber 3 for either recirculation or flowing of the cleaning solution/rinse directly to drain depending upon the positioning of the valves of the apparatus. The fluids can be circulated in the same sequence as described above with respect to cleaning components in the cleaning chamber and the device blown out with 0.1 micron filtered dry nitrogen to dry.

It has been found that the TMAH solutions, and the concentrations indicated above, may be unnecessarily harsh on certain plastics used in valves and regulators. While chloro-fluorocarbons will generally not be harmed by the cleaning solution at 85° C., materials such as Vespel by DuPont are attacked at 85° C. Vespel can be washed with the cleaning solution of the invention at 60° C. in the same concentrations that are used on stainless steel 85° C.

Higher concentrations of the organic base in the cleaning solution will exhibit the maximum activity toward organic films and contaminates, but may be unnecessarily expensive in the electronic grades of chemicals used. It has been found that the aforementioned lower concentration cleaning solutions are sufficiently powerful for the purpose. They are highly disassociated and last for a reasonable period time. If the pH is observed to dip below 12, for example, they can re-energized with the addition of more of the organic base. The most economical combination of cleaning fluid is one with minimum TMAH, a small amount of surfactant and the highest possible cleaning temperature. High washing temperatures are preferably accompanied with rinsing at 85° C. to near boiling. The de-ionized rinse water has greater activity at these temperatures.

While I have shown and described only one embodiment in accordance with the present invention, it is understood that the same is not limited thereto, but is susceptible to numeral changes and modifications as known in those skill in the art. For the example, the method and apparatus of the invention are not limited to use with the composition of the invention but have application for cleaning a wide variety of materials with other cleaning solutions and rinses. Further, the cleaning composition of the invention is not only useful for cleaning stainless steel but other stainless materials as well including high-nickel alloys and stain resistant non-metallic materials, particularly plastic. Therefore, I do not wish to be limited to the detail shown and described herein, but intend to cover all such changes and modifications as encompassed by the scope of the appended claims.

What is claimed is:

1. A method of cleaning a surface to absolute or near-absolute cleanliness such that when dry nitrogen is filtered through a 0.01 $\mu$ filter, passed over the cleaned, dried surface and through a laser particle counter, the laser particle counter will detect less than five particles having a diameter $\geq 0.1$ $\mu$ per cubic foot of gas flow, a condensation nucleating counter will detect no more than five particles having a diameter of 0.02 $\mu$ or larger, and wherein residual surface ions and residual surface organics, if any, are present in a concentration of less than one part per million, said method comprising contacting a surface of a member to be cleaned with jets of a cleaning solution which impinge on the surface at high speed and flow over the surface so as to create a scrubbing action on the surface and flowing a rinse liquid in contact with the surface to be cleaned to rinse the surface, wherein the rinse liquid is recirculated into contact with the surface during said rinsing, the recirculating rinse liquid being filtered during recirculation to remove all particles having a diameter equal to or greater than 0.2 $\mu$.

2. A method according to claim 1, wherein the rinse liquid is filtered to remove over 99% of particles having a diameter equal to greater than 0.02 $\mu$.

3. A method according to claim 1, wherein the rinse liquid is recirculated into contact with the cleaned surface multiple times during said rinsing and is filtered each time it is recirculated.

4. A method according to claim 1, wherein the rinsing liquid is de-ionized water.

5. A method according to claim 4, wherein the de-ionized rinse water has a resistance between 17 and 18 megohm-cm.

6. A method according to claim 4, further comprising the step of heating the de-ionized rinse water to a temperature of at least 60° C. before flowing it in contact with the cleaned surface.

7. A method according to claim 6, wherein the de-ionized rinse water is heated to at least about 85° C., and its resistance is $\geq 17$ megohm-cm, measured at 25° C.

8. A method according to claim 1, including flowing the rinse liquid in contact with the surface at a speed of $\geq 60$ mph.

9. A method according to claim 1, wherein the recirculating rinse liquid is filtered immediately prior to contacting said surface, and downstream of pump means for recirculating the rinse liquid.

10. A method according to claim 1, further comprising the step of drying the rinsed surface, said drying step including blowing the surface free of surface water with dry, filtered nitrogen gas.

11. A method according to claim 1, wherein said rinsing step further includes rinsing the surface in a rinse liquid which is not recirculated before the rinsing surface in the rinse liquid which is recirculated.

12. A method according to claim 1, wherein the member is a gas flow regulating device or a component thereof.

13. A method according to claim 1, wherein prior to contacting the surface with the cleaning solution the member is subjected to a preliminary, solvent cleaning, and is electroplated and passivated.

14. A method according to claim 1, wherein the surface to be cleaned is formed of a stainless material.

15. A method according to claim 1, wherein the cleaning solution is recirculated into contact with said surface, the recirculated cleaning solution being filtered during recirculation to remove all particles having a diameter $\geq 0.2 \mu$.

16. A method according to claim 15, wherein the cleaning solution is recirculated into contact with the surface multiple times and is filtered each time it is recirculated to remove over 99% of particles having a diameter $\geq 0.02 \mu$.

17. A method according to claim 15, including heating the cleaning solution before contacting the surface to be cleaned with said cleaning solution.

18. A method according to claim 15, wherein the cleaning solution is flowed into contact with the surface to be cleaned at speeds $\geq 60$ mph.

19. A method according to claim 1, further comprising drying the rinsed surface of the member to provide a surface which is at least nearly absolutely clean.

20. A method according to claim 19, further comprising assembling the member with the at least nearly absolutely clean surface into a gas flow equipment whereby the surface is contaminated such that it is no longer nearly absolutely clean, and recleaning the surface to a condition of at least nearly absolute cleanliness by flowing gas over said surface in said gas flow equipment to sweep the contamination from said surface.

21. An apparatus for cleaning a surface to absolute or near-absolute cleanliness such that when dry nitrogen is filtered through a 0.01 $\mu$ filter, passed over the cleaned, dried surface and through a laser particle counter, the laser particle counter will detect less than five particles having a diameter $\geq 0.1 \mu$ per cubic foot of gas flow, a condensation nucleating counter will detect no more than five particles having a diameter of 0.02 $\mu$ or larger, and wherein residual surface ions and residual surface organics, if any, are present in a concentration of less than one part per million, said apparatus comprising means for contacting a surface of a member to be cleaned with a cleaning solution which impinges on the surface at high speed and flows over the surface to create a scrubbing action on the surface, and means for flowing a rinse liquid in contact with the surface to rinse the surface, said means for flowing a rinse liquid including means for recirculating the rinse liquid into contact with the surface during rinsing and means for filtering the recirculating liquid immediately before it is flowed into contact with the surface to remove all particles having a diameter greater than or equal to 0.2 $\mu$.

22. An apparatus according to claim 21, further comprising means for heating the rinse liquid before it is flowed in contact with the surface.

23. An apparatus according to claim 21, wherein said means for flowing the rinse liquid in contact with the surface includes at least one spray head having apertures therein for forming jets of rinse liquid for impinging upon the surface.

24. An apparatus according to claim 21, wherein said means for flowing a rinse liquid comprises a container holding a supply of the rinse liquid, a pump for pumping rinse liquid from the container to and through said means for filtering and to said surface for rinsing said surface, said means for filtering being located downstream of said pump and said container along a flow path of the rinse liquid to said surface.

25. An apparatus according to claim 24, wherein said pump is a diaphragm pump.

26. An apparatus according to claim 24, wherein said means for recirculating includes a chamber in which said member is located and including drain means adjacent said surface being rinsed for returning the used rinse liquid from the chamber to the container for recirculating.

27. An apparatus according to claim 21, further comprising means for drying the rinsed surface, said means for drying including means for blowing the surface with dry, filtered nitrogen gas.

28. An apparatus according to claim 21, wherein said means for contacting the surface with a cleaning solution includes a container holding a supply of the cleaning solution and a pump for pumping cleaning solution from the container to and through said means for filtering the rinse liquid for filtering the cleaning solution to remove all particles having a diameter $\geq 0.2 \mu$.

29. An apparatus according to claim 28, further comprising means for recirculating the used cleaning solution back into contact with the surface by way of the means for filtering.

30. An apparatus according to claim 21, further comprising means for rinsing the cleaned surface with a rinse liquid which is not recirculated.

31. An apparatus according to claim 21, further comprising means for heating the cleaning solution.

32. An apparatus for cleaning a surface to absolute or near-absolute cleanliness such that when dry nitrogen is filtered through a 0.01 $\mu$ filter, passed over the cleaned, dried surface and through a laser particle counter, the laser particle counter will detect less than five particles having a diameter $\geq 0.1 \mu$ per cubic foot of gas flow, a condensation nucleating counter will detect no more than five particles having a diameter of 0.02 $\mu$ or larger, and wherein residual surface ions and residual surface organics, if any, are present in a concentration of less than one part per million, said apparatus comprising a cleaning chamber within which a member having a surface to be cleaned can be placed, a first container holding a cleaning solution, a second container holding a rinse liquid, a pump, a filter, fluid supply line means connecting each of said first and second containers to an input of said pump and connecting an output of said pump with said chamber by way of the filter for filtering the cleaning solution and rinse liquid immediately before introduction into the cleaning chamber, supply valve means in said fluid supply line means for selectively pumping one of the cleaning solution and rinse liquid from its container through the fluid supply line means to the cleaning chamber by way of the pump and filter, fluid return line means for returning the cleaning solution from the chamber to the first container for recirculation and for returning the rinse liquid from the chamber to the second container for recirculation, and return valve means for selectively returning one of the cleaning solution and the rinse liquid to its corresponding container by way of said return line means for recirculation, wherein at least one spray head is provided in said cleaning chamber, said spray head having a plurality of apertures therein for forming jets of cleaning solution and rinse liquid for impinging upon a surface being cleaned, said pump maintaining a pressure of cleaning solution and rinsing liquid of at least 40 psi whereby jets of cleaning solution and rinse liquid impinge upon the surface being cleaned at speeds $\geq 60$ mph.

33. An apparatus according to claim 32, wherein said fluid return line means includes means for directing a liquid from the cleaning chamber to a drain so that it is not recirculated.

34. An apparatus according to claim 32, wherein each of the first and second containers contains means for heating the liquid therein to a predetermined temperature.

35. An apparatus according to claim 32, wherein said filter removes all particles in a liquid flowing through the filter which have a diameter $\geq 0.2\ \mu$.

36. An apparatus according to claim 32, wherein said pump is a diaphragm pump.

37. An apparatus according to claim 32, wherein said supply valve means and said return valve means are pneumatically operated valves.

38. An apparatus according to claim 32, further comprising a microprocessor which operates the supply valve means and the return valves means to coordinate cleaning and rinsing operating cycles of the apparatus.

* * * * *